United States Patent
Kim et al.

(10) Patent No.: US 10,163,741 B2
(45) Date of Patent: Dec. 25, 2018

(54) SCRIBE LANE STRUCTURE IN WHICH PAD INCLUDING VIA HOLE IS ARRANGED ON SAWING LINE

(71) Applicant: SAMSUNG ELECTRONICS CO., LTD., Suwon-si, Gyeonggi-Do (KR)

(72) Inventors: Young-Ho Kim, Hwaseong-si (KR); Ho-Sung Song, Soul (KR); Jeong-Sik Nam, Seoul (KR); Kyoung-Min Kim, Namyangju-si (KR); Tae-Hyeong Lee, Chungcheongnam (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/677,053

(22) Filed: Aug. 15, 2017

(65) Prior Publication Data

US 2018/0174933 A1 Jun. 21, 2018

(30) Foreign Application Priority Data

Dec. 28, 2016 (KR) .................. 10-2016-0181445

(51) Int. Cl.
*G01R 31/28* (2006.01)
*H01L 21/66* (2006.01)
*H01L 21/78* (2006.01)
*H01L 23/544* (2006.01)

(52) U.S. Cl.
CPC .......... *H01L 22/34* (2013.01); *G01R 31/2856* (2013.01); *H01L 21/78* (2013.01); *H01L 23/544* (2013.01); *H01L 2223/5446* (2013.01)

(58) Field of Classification Search
CPC ........ H01L 22/34; H01L 21/78; H01L 23/544; H01L 2223/5446; G01R 31/2856
See application file for complete search history.

(56) References Cited

U.S. PATENT DOCUMENTS

| | | | |
|---|---|---|---|
| 5,003,374 | A | 3/1991 | Vokoun, III |
| 5,285,082 | A | 2/1994 | Axer |
| 5,654,582 | A | 8/1997 | Kijima et al. |
| 7,129,566 | B2 | 10/2006 | Uehling et al. |
| 7,446,553 | B2 | 11/2008 | Cano et al. |
| 8,039,367 | B2 | 10/2011 | Wu |
| 9,379,065 | B2 | 6/2016 | Keser et al. |
| 9,818,701 | B2 * | 11/2017 | Yoshizawa ............ H01L 23/562 |

(Continued)

FOREIGN PATENT DOCUMENTS

KR    1020170070434 A    6/2017

*Primary Examiner* — Cheung Lee
*Assistant Examiner* — Stephen C Smith
(74) *Attorney, Agent, or Firm* — Volentine, Whitt & Francos, PLLC

(57) ABSTRACT

A semiconductor device structure, including integrated circuits of semiconductor chips and scribe lanes between the regions in which the circuits have been formed, has at least one redistribution pad disposed in one of the scribe lanes for simultaneously testing a group of the integrated circuits, and a metal interconnection structure disposed beneath the redistribution pad(s). The metal interconnection structure includes at least conductive via contacting the redistribution pad at the bottom of the pad. The conductive via(s) is/are arranged so that at least a portion of each via remains attached to the redistribution pad when the structure is sawed along the scribe lane.

11 Claims, 11 Drawing Sheets

(56) References Cited

U.S. PATENT DOCUMENTS

| | | | |
|---|---|---|---|
| 9,874,598 B2* | 1/2018 | Pagani | G01R 31/275 |
| 2010/0207251 A1 | 8/2010 | Yu et al. | |
| 2013/0049234 A1 | 2/2013 | Lin et al. | |
| 2013/0057312 A1* | 3/2013 | Pagani | H01L 21/76898 |
| | | | 324/762.01 |
| 2013/0069206 A1* | 3/2013 | Yoshizawa | H01L 22/34 |
| | | | 257/620 |
| 2013/0316471 A1 | 11/2013 | Tsai et al. | |
| 2017/0170081 A1 | 6/2017 | Byun et al. | |

* cited by examiner

III - III'

IV - IV'

SCRIBE LANE STRUCTURE IN WHICH PAD INCLUDING VIA HOLE IS ARRANGED ON SAWING LINE

PRIORITY STATEMENT

This application claims the benefit of Korean Patent Application No. 10-2016-0181445, filed on Dec. 28, 2016, in the Korean Intellectual Property Office, the disclosure of which is hereby incorporated by reference in its entirety.

BACKGROUND

The inventive concept relates to semiconductor devices and the manufacturing of the same. More particularly, the inventive concept relates to an article comprising a semiconductor wafer having scribe lanes and to a method of manufacturing semiconductor devices that includes sawing a semiconductor wafer along the scribe lanes.

The fabricating of semiconductor devices may generally include the fabricating of chips on a semiconductor wafer, an electrical die sorting (EDS) test on the chips fabricated on the semiconductor wafer to determine which of the chips meet certain quality standards, and a dicing process of separating the wafer into individual chips. The dicing process may be carried out by blade or laser "sawing" depending on a state or the thickness of the wafer. When the wafer is cut by a blade or laser during a sawing process, a problem occurs in that silicon particles freed from the wafer may become a contaminant.

For example, such particles can contaminate a bonding pad surface of one or more of the chips. In this case, a bonding process is not performed normally, and the yield of the chips is reduced. Because particles present on the surface of the chip damage a passivation layer that is a final protection layer of the chip, the reliability of a semiconductor package that includes such a damaged passivation layer is reduced.

SUMMARY

According to an aspect of the inventive concept, there is provided an article of manufacture of such structure including: a semiconductor substrate, integrated circuits arrayed across the semiconductor substrate as spaced from one another across scribe lanes, at least one redistribution pad disposed in one of the scribe lanes and electrically connected to a group of the integrated circuits such that the integrated circuits of the group can be simultaneously tested by applying signals through the at least one redistribution pad, and a metal interconnection structure interposed between the substrate and the at least one redistribution pad. The metal interconnection structure include at least one respective conductive via contacting each e redistribution pad at a bottom portion of the redistribution pad.

According to another aspect of the inventive concept, there is provided a method of singulating semiconductor chips, the method including: providing a structure including a semiconductor substrate, respective integrated circuits of the semiconductor chips arrayed across the semiconductor substrate as spaced from each other by scribe lanes, a redistribution pad in one of the scribe lanes, and at least one conductive via contacting a bottom portion of the redistribution pad, and cutting the semiconductor substrate along a longitudinal axis of said one of the scribe through the redistribution pad and over such a portion of the width of said one of the scribe lanes that one part of each said at least one conductive via is removed by the cutting whereas another part of each said at least one conductive via remains attached to the redistribution pad.

According to another aspect of the inventive concept, there is provided an article of manufacture for use in forming semiconductor chips, including: a semiconductor substrate, substantially identical integrated circuits arrayed across the semiconductor substrate as separated from one another across scribe lanes, at least one redistribution pad of electrically conductive material disposed on the semiconductor substrate in one of the scribe lanes; and at least one conductive via contacting the redistribution pad at a bottom portion of the redistribution pad, and in which the redistribution pad is electrically connected to each of a group of the integrated circuits and is disposed along a longitudinal central axis of said one of the scribe lanes.

BRIEF DESCRIPTION OF THE DRAWINGS

The inventive concept will be more clearly understood from the following detailed description of examples thereof taken in conjunction with the accompanying drawings in which.

DETAILED DESCRIPTION

Figure 1:
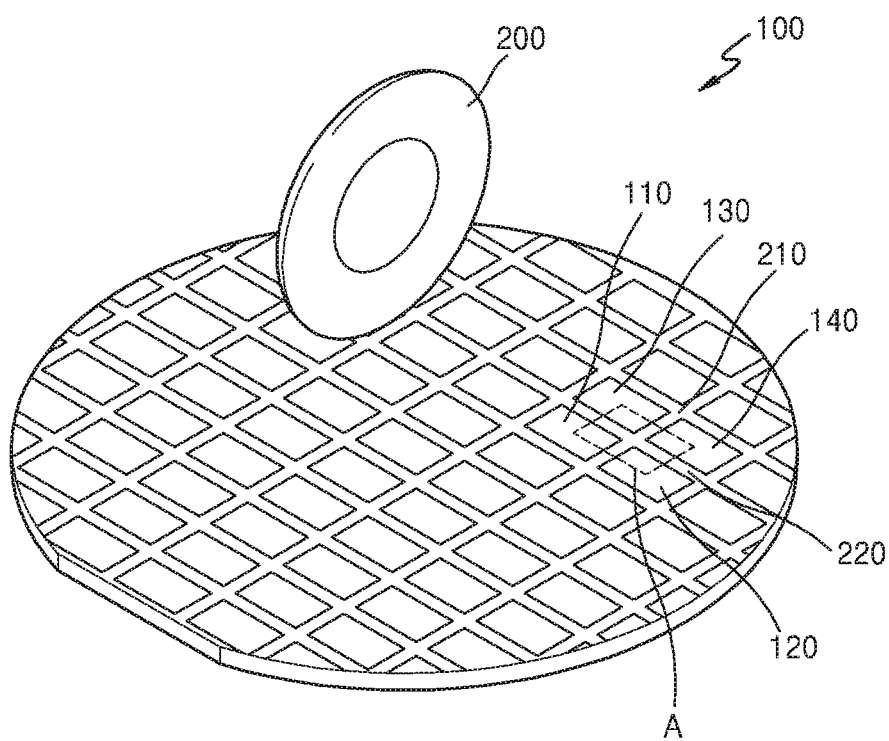
FIG. 1 is a conceptual diagram of a process of sawing a semiconductor wafer, according to the inventive concept.

FIG. 1 illustrates a set up in a process of sawing a semiconductor wafer 100 in a method of manufacturing semiconductor devices according to the inventive concept.

Figure 2:
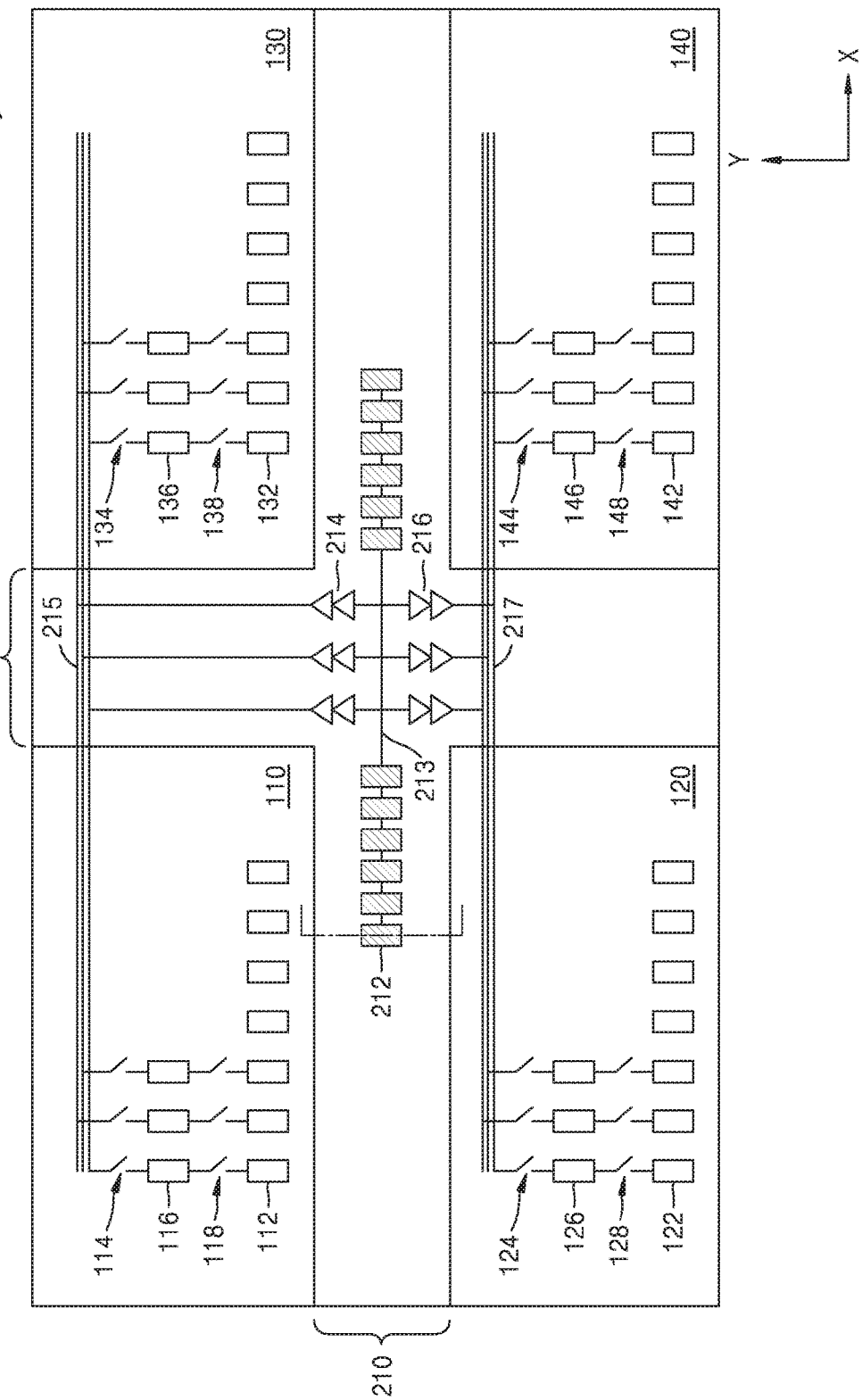
FIG. 2 is a schematic diagram of a region A of the wafer shown in FIG. 1.

Referring to FIG. 1, semiconductor chips 110, 120, 130, and 140 are regularly and repeatedly formed in the semiconductor wafer 100 as arrayed across the semiconductor wafer 100. Scribe lanes 210 and 220 are left or defined between the semiconductor chips 110, 120, 130, and 140 as extending in a first direction X of the semiconductor wafer 100 and in a second direction Y that is perpendicular to the first direction X. FIG. 2 is an enlarged view of region A of FIG. 1. Here, although elements 110, 120, 130 and 140 are referred to as "chips" for ease of explanation, in this state the elements 110, 120, 130 and 140 actually comprise the respective integrated circuits of the chips that will be formed when the semiconductor wafer is cut along the scribe lanes, as will be described in more detail below.

Various test process patterns, test pads connected to the test process patterns, and photolithography patterns such as an overlay key or an alignment key may be formed in the scribe lanes 210 and 220. In addition, and with reference to FIG. 2, redistribution pads 212, test circuits 214 and 216 connected to the redistribution pads 212, and redistribution lines 213, 215, and 217 may be formed in the scribe lanes 210 and 220.

Examples of small scale semiconductor packages that include chips formed from a semiconductor wafer include a ball grid array (GBGA) package, a chip scale package (CSP), a micro BGA (mBGA) package, and a wafer level chip scale package (WL-CSP). Redistribution pads of the type depicted in FIG. 2 are used in, for example, a wafer level chip scale package (WL-CSP)

The WL-CSP is characterized in that a bonding pad of a semiconductor chip and a redistribution pad having a greater size than the bonding pad are arranged to make an internal connection and then an external connection terminal, such as a solder ball or a bonding wire, is formed on and/or connected to the bonding pad.

In the present example, the redistribution pads 212 are disposed on the scribe lanes 210 and 220 and a group of the semiconductor chips 110, 120, 130, and 140 may be simultaneously tested using the redistribution pads 212.

The semiconductor wafer 100 is sawed along the scribe lanes 210 and 220, and thus the semiconductor chips 110, 120, 130, and 140 are separated from each other. A cutter 200, for example, a diamond wheel blade, may be used to saw the semiconductor wafer 100. In other examples, a laser that irradiates the scribe lanes 210 and 220 with a laser beam may be used to saw the semiconductor wafer 100 to separate the semiconductor chips 110, 120, 130, and 140 from one another. That is, here the term "saw" may refer to any process of physically cutting the semiconductor wafer 100.

As semiconductor chips 110, 120, 130, and 140 are scaled down, the semiconductor wafer 100 becomes thinner. Accordingly, the number of test pads and redistribution pads 212 in the scribe lanes 210 and 220 increases and hence, the metal density of the scribe lanes 210 and 220 increases. As a result, metal of the redistribution pads 212 separates or a large amount of particles are produced when the semiconductor wafer 100 is sawed.

To solve these problems, according to the inventive concept, a via is provided along a sawing line in an inter-metal dielectric (IMD) of a pad within the scribe lanes 210 and 220. Accordingly, the via holds pad metal together to prevent the pad from separating or an excessive amount of particles from being generated.

Still referring to FIG. 2, one group of the semiconductor chips, e.g., first through fourth semiconductor chips 110, 120, 130, and 140, arrayed across the semiconductor wafer 100 are illustrated. The scribe lanes 210 and 220 are arranged between the first through fourth semiconductor chips 110, 120, 130, and 140. The (integrated circuits of the) first through fourth semiconductor chips 110, 120, 130, and 140 respectively include main pads 112, 122, 132, and 142, first switches 114, 124, 134, and 144, input buffers 116, 126, 136, and 146, and second switches 118, 128, 138, and 148.

The main pads 112, 122, 132, and 142 may be respectively connected to internal circuitries of the first through fourth semiconductor chips 110, 120, 130, and 140 and may transfer signals to the internal circuitries. The first through fourth semiconductor chips 110, 120, 130, and 140 may respectively operate according to signals, e.g., command and address signals, applied to the main pads 112, 122, 132, and 142.

An EDS test may be performed on the first through fourth semiconductor chips 110, 120, 130, and 140 of the semiconductor wafer 100 by test equipment. In this regard, to minimize test time, the first through fourth semiconductor chips 110, 120, 130, and 140 may be simultaneously tested in parallel to each other.

The test equipment may simultaneously apply signals to the main pads 112, 122, 132, and 142 of the first through fourth semiconductor chips 110, 120, 130, and 140 by using the redistribution pads 212, the test circuits 214 and 216, and the redistribution lines 213, 215, and 217 that are arranged in the scribe lanes 210 and 220. The test equipment may apply command and address signals to the redistribution pads 212.

The redistribution pads 212 and the test circuits 214 and 216 may be arranged in the scribe lane 210 of the semiconductor wafer 100 in the first direction X. The redistribution line 213 may be connected between the redistribution pads 212 and the test circuits 214 and 216. For simplicity of the drawings, the first redistribution line 213 is shown as one line; however, multiple first redistribution lines 213 may be correspondingly arranged one-to-one between the redistribution pads 212 and the test circuits 214 and 216.

The first and second test circuitries 214 and 216 may be configured as, for example, repeater circuits that apply buffer signals to the redistribution pads 212. The first test circuits 214 may be connected to the first and third semiconductor chips 110 and 130 through the second redistribution lines 215. The second test circuits 216 may be connected to the second and fourth semiconductor chips 120 and 140 through the second redistribution lines 217.

Each of the first through fourth semiconductor chips 110, 120, 130, and 140 may receive signals applied to the redistribution pads 212 through the first and second test circuits 214 and 216 and the second redistribution lines 215 and 217. The first through fourth semiconductor chips 110, 120, 130, and 140 may be set to turn on the first switches 114, 124, 134, and 144 and the second switches 118, 128, 138, and 148 during an EDS parallel test.

In the first semiconductor chip 110, signals received through the second redistribution lines 215 may be transferred to the main pads 112 through the first switches 114, the first input buffers 116, and the second switches 118. The first input buffer 116 may buffer signals of the first redistribution lines 213 in transferring the signals to the main pads 112.

The second semiconductor chip 120 may transfer signals received through the second redistribution lines 217 to the main pads 122 through the first switches 124, the first input buffers 126, and the second switches 128. The third semiconductor chip 130 may transfer signals received through the second redistribution lines 215 to the main pads 132 through the first switches 134, the first input buffers 136, and the second switches 138. The fourth semiconductor chip 140 may transfer signals received through the second redistribution lines 217 to the main pads 142 through the first switches 144, the first input buffers 146, and the second switches 148.

The first through fourth semiconductor chips 110, 120, 130, and 140 may respectively operate according to signals, e.g., command and address signals, applied to the main pads 112, 122, 132, and 142. A result of operation may be monitored by the test equipment.

Figure 3:
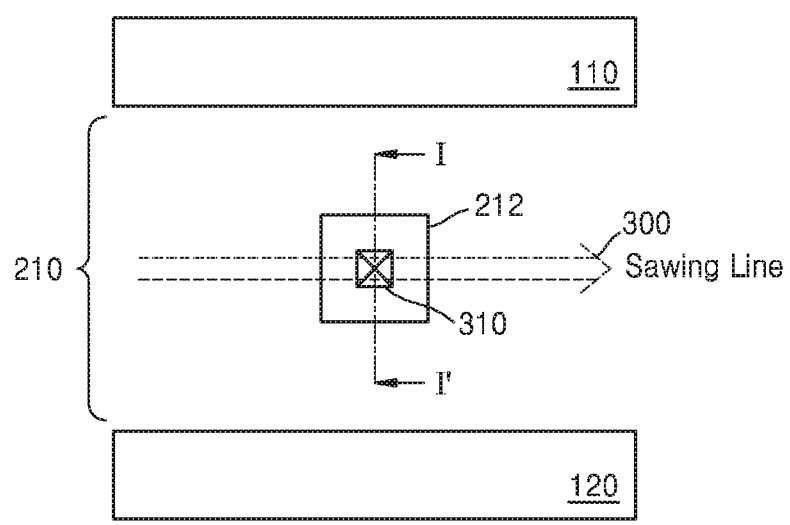
FIG. 3 is a conceptual diagram of a first of a redistribution pad arrangement on a scribe lane according to the inventive concept.
Figure 4:
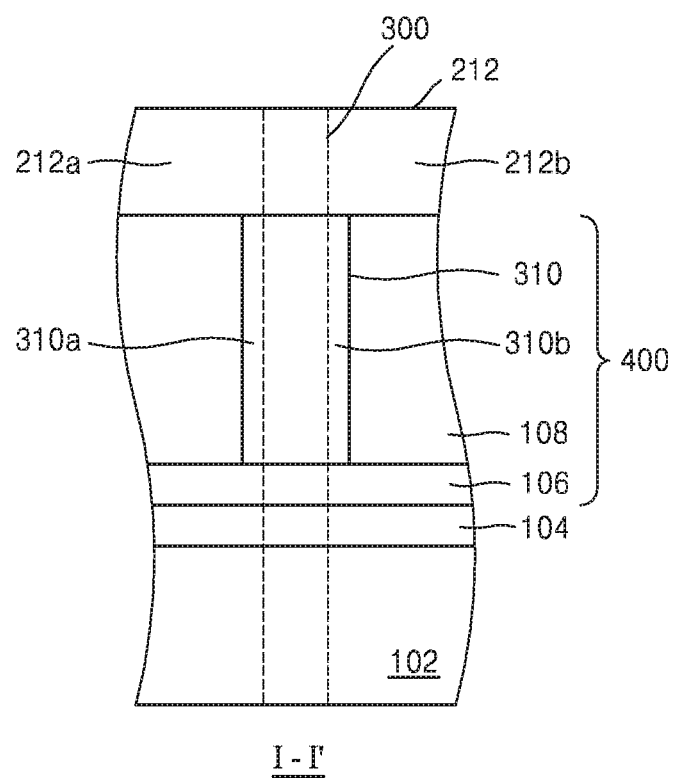
FIG. 4 is a cross-sectional view taken along line I-I' of FIG. 3.

FIGS. 3 and 4 illustrate a first example of a redistribution pad arranged on a sawing line 300 of a scribe lane according to the inventive concept. FIG. 3 is an enlarged diagram of the sawing line 300 passing through the redistribution pad 212 of FIG. 2. FIG. 4 is a cross-sectional view taken along line I-I' of FIG. 3. The sawing line 300 overlaps the longitudinal axis of the scribe lane and may overlap the central longitudinal axis of the scribe lane.

Referring to FIG. 3, the redistribution pad 212 is arranged in the scribe lane 210 between the first semiconductor chip 110 and the second semiconductor chip 120. At least one conductive via 310 extends to the redistribution pad 212 so as to contact a bottom portion of the redistribution pad 212. The sawing line 300 is confined within the bounds of the scribe lane 210. The sawing line 300 may be set to pass through a central region of the conductive via 310 of the redistribution pad 212.

In FIG. 3, the conductive via 310 is illustrated as having a rectangular upper surface (or horizontal cross section). However, the conductive via 310 may have round, oval, triangular, hexagonal, octagonal, or another appropriate cross-sectional shape.

In the figure, a single redistribution pad 212 is shown on the central longitudinal axis of the scribe lane, i.e., along the sawing line 300, for convenience of description and illustration; however, multiple redistribution pads 212 each provided with a respective conductive via 310 may be arranged on the central longitudinal axis of the scribe lane so as to be in the path of the sawing line 300. In other examples, each redistribution pad 212 is provided with a plurality of conductive vias 310 and the sawing line 300 may be set to pass through central regions of the conductive vias 310.

Referring to FIG. 4, the redistribution pad 212 may be a metal pad, and a metal interconnection structure 400 may be disposed below the redistribution pad 212. The metal interconnection structure 400 may be disposed on an insulating layer 104 on a semiconductor substrate 102. The metal interconnection structure 400 may include a metal layer 106 formed on the insulating layer 104 and the conductive via(s) 310 in an intermetallic insulating layer 108 in contact with the metal layer 106. The conductive via 310 may be in direct contact with the redistribution pad 212.

The metal layer 106 may be formed of copper, aluminum, tungsten, titanium, another conductive material, and/or a combination thereof. The intermetallic insulating layer 108 may be formed of an oxide, nitride, oxynitride, a low-k dielectric, an ultra-low-k dielectric, and/or a combination thereof. The conductive via 310 may include a metal, in particular, copper or gold.

In some examples, a plurality of metal interconnection structures 400 each including a metal layer 106 and the conductive via 310 in the intermetallic insulating layer 108 may be interposed between redistribution pads 212, respectively, and the semiconductor substrate 102.

In some examples, a plurality of the conductive vias 310 may extend through the intermetallic insulating layer 108 between the redistribution pad(s) 212 and the metal layer 106 on the semiconductor substrate 102. The conductive vias 310 may be arranged in a line (along the central longitudinal axis of the scribe lane) beneath the redistribution pad(s) 212 so as to all be in the path of the sawing line 3000.

If the substrate 102 (wafer) is cut along the sawing line 300 through the central region of a conductive via 310 of a redistribution pad 212 within the scribe lane 210, portions 310a and 310b of the conductive via 310 and portions 212a and 212b of the redistribution pad 212 may remain in the scribe lane 210. In particular, the portions 310a and 310b of conductive via 310 remain stuck to the intermetallic insulating layer 108. Therefore, portions 212a and 212b of the metal of the redistribution pad 212 in contact with the portions 310a and 310b of conductive via 310 may not lift off. The intermetallic insulating layer 108. Accordingly, a problem in which the metal of the redistribution pads 212 is separated from the intermetallic insulating layer 108 or reduced to particles and blown away onto the chips by the sawing process may be prevented. Thus, the reliability, e.g., insulating properties, of the semiconductor chips may be sustained.

Figure 5:
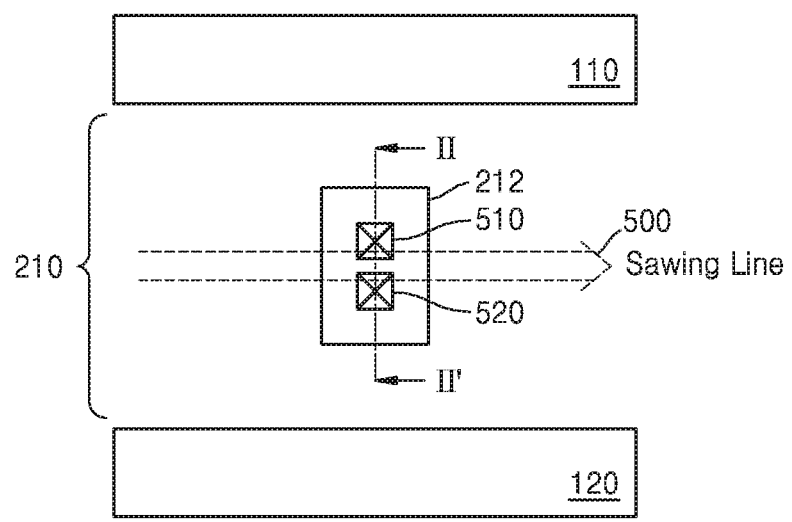
FIG. 5 is a conceptual diagram of a second of a redistribution pad arrangement on a scribe lane according to the inventive concept.
Figure 6:
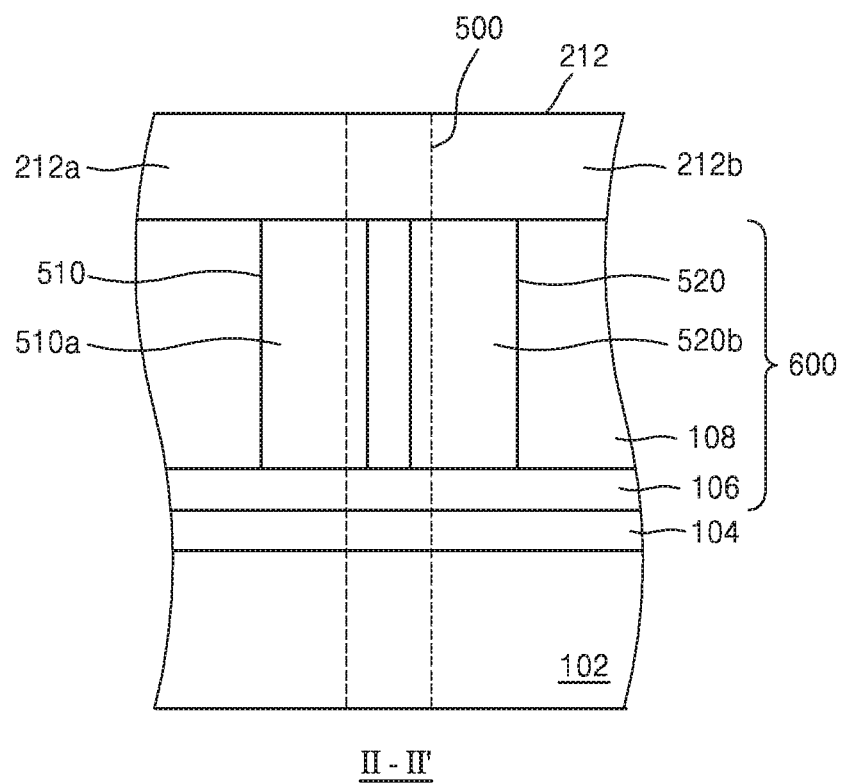
FIG. 6 is a cross-sectional view taken along line II-II' of FIG. 5.

FIGS. 5 and 6 illustrate a second example of a redistribution pad arrangement on a scribe lane, e.g., the scribe lane 210 of FIG. 2, according to the inventive concept. FIG. 6 is a cross-sectional view taken along line II-If of FIG. 5.

Referring to FIG. 5, at least two conductive vias 510 and 520 are provided in contact with a bottom portion of the redistribution pad 212. The conductive vias 510 and 520 beneath the redistribution pad 212 are disposed side-by-side on opposite sides of the longitudinal axis of the scribe lane (e.g., 210 in FIG. 2) as spaced apart from each other along a line perpendicular to the longitudinal axis of the scribe lane. The sawing line 500 may be set to pass through parts of the conductive vias 510 and 520 of the redistribution pad 212 such that those parts of the conductive vias 510 and 520 are cut simultaneously. The shapes of upper surfaces of the conductive vias 510 and 520 (or horizontal cross-sectional shapes) are illustrated as rectangular. According to inventive concept, the upper surfaces (or cross sections as viewed in plan) of the conductive vias 510 and 520 may be round, oval, triangular, hexagonal, or octagonal, or any other appropriate shape.

Referring to FIG. 6, a metal interconnection structure 600 is disposed below the redistribution pad 212. The metal interconnection structure 600 may include the metal layer 106 on the insulating layer 104 on the semiconductor substrate 102 and the conductive vias 510 and 520 in the intermetallic insulating layer 108 in contact with the metal layer 106.

In some examples, a plurality of metal interconnection structures 600 each including a metal layer 106 and the conductive vias 510 and 520 in the intermetallic insulating layer 108 may be interposed between redistribution pads 212, respectively, and the semiconductor substrate 102.

According to this example of the inventive concept, a plurality of the conductive vias 510 and 520 in the intermetallic insulating layer 108 may be interposed between the redistribution pad 212 and the metal layer 106 on the semiconductor substrate 102. The conductive vias 510 and 520 may be arranged on opposite sides of the central longitudinal axis of the scribe lane (e.g., 210 in FIG. 2) as spaced apart along a line perpendicular to the longitudinal axis of the scribe lane.

If the substrate 102 (wafer) is cut along the sawing line 500 passing through the scribe lane 210, portions 510a and 520b of the conductive vias 510 and 520 and portions 212a and 212b the redistribution pad 212 may remain in the scribe lane 210. The remaining portions 510a and 520b of the conductive vias 510 and 520 remain stuck to the intermetallic insulating layer 108. Therefore, a problem in which metal of the redistribution pad 212 in contact with the conductive vias 510 and 520 is separated from the underlying intermetallic insulating layer 108 or is reduced to particles and blown away by the sawing process may be prevented. Thus, the reliability of the semiconductor chips, e.g., the insulating properties of the chips, may be sustained.

Figure 7:
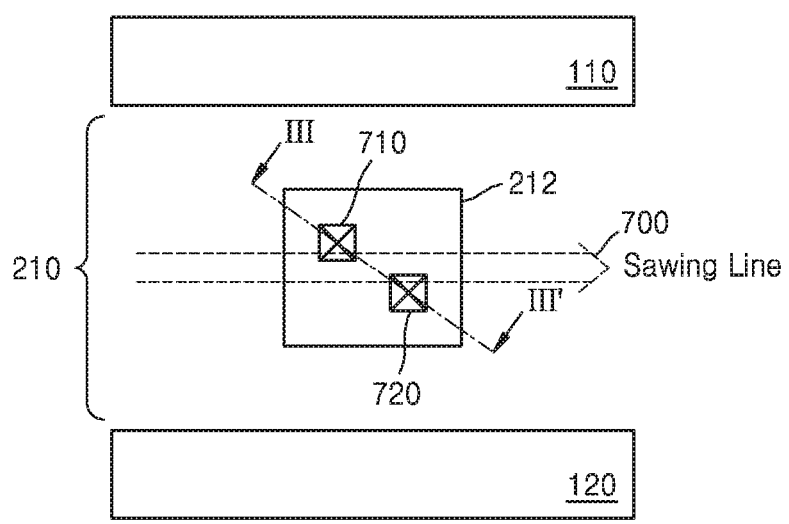
FIG. 7 is a conceptual diagram of a third of a redistribution pad arrangement on a scribe lane according to the inventive concept.
Figure 8:
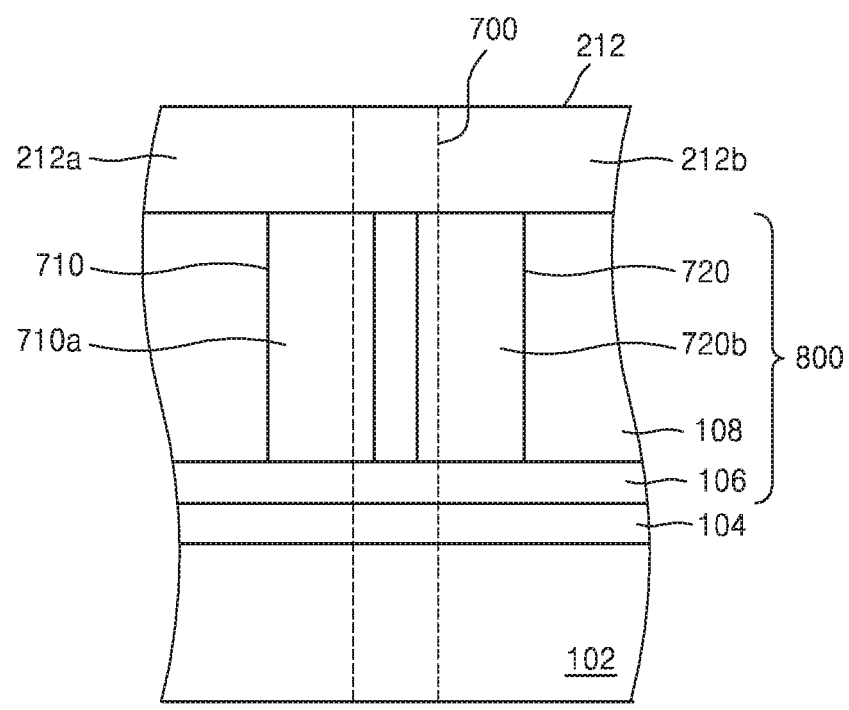
FIG. 8 is a cross-sectional view taken along line III-III' of FIG. 7.

FIGS. 7 and 8 illustrate a third example of a redistribution pad arrangement on a scribe lane, e.g., the scribe lane 210 of FIG. 2, according to inventive concept. FIG. 8 is a cross-sectional view taken along line of FIG. 7.

Referring to FIG. 7, at least two conductive vias 710 and 720 are disposed beneath the redistribution pad 212 in contact with a bottom portion of the redistribution pad 212. The conductive vias 710 and 720 are arranged on opposite sides of the longitudinal axis of the scribe lane along a line extending obliquely to the longitudinal axis. The sawing line 700 may be set to pass through parts of the conductive vias 710 and 720 one after the other. Upper surfaces (or horizontal cross sections) of the conductive vias 710 and 720 are illustrated as rectangular. However, according to inventive concept, the upper surfaces (or horizontal cross sections) of the conductive vias 710 and 720 may be round, oval, triangular, hexagonal, or octagonal shapes, or may have any other appropriate shape.

Referring to FIG. 8, a metal interconnection structure 800 is disposed below the redistribution pad 212. The metal interconnection structure 800 may include the metal layer 106 formed on the insulating layer 104 on the semiconductor substrate 102 and the conductive vias 710 and 720 in the intermetallic insulating layer 108 in contact with the metal layer 106.

In some examples, a plurality of metal interconnection structures 800 each including a metal layer 106 and the conductive vias 710 and 720 in the intermetallic insulating layer 108 may be interposed between redistribution pads 212, respectively, and the semiconductor substrate 102. In some examples, a plurality of conductive vias 710 and 720 may be arranged beneath the redistribution pads 212 in a zigzag shape in the longitudinal direction of the scribe lane corresponding to the sawing line 700.

In FIG. 8, when the semiconductor substrate is cut along the sawing line 700 through the conductive vias 710 and 720 within the scribe lane 210, one portion of conductive via 710 is first cut through and then a corresponding portion of conductive via 720 is cut through, but other portions of the conductive vias 710a and 720b and portions of the redistribution pads 212a and 212b remain in the scribe lane 210. Because portions of the conductive vias 710a and 720b remain stuck to the intermetallic insulating layer 108, a problem in which metal of the redistribution pads 212a and 212b in contact with the conductive vias 710a and 720b is separated from the underlying intermetallic insulating layer 108 or is reduced to particles and blown away by sawing process may be prevented. Thus, the reliability of the semiconductor chips, e.g., the insulating properties of the chips, may be sustained.

Figure 9:
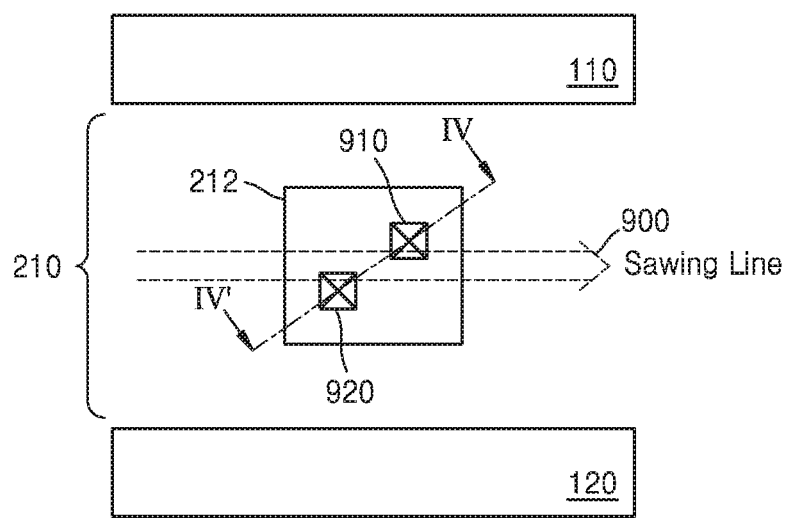
FIG. 9 is a conceptual diagram of a fourth of a redistribution pad arrangement on a scribe lane according to the inventive concept.
Figure 10:
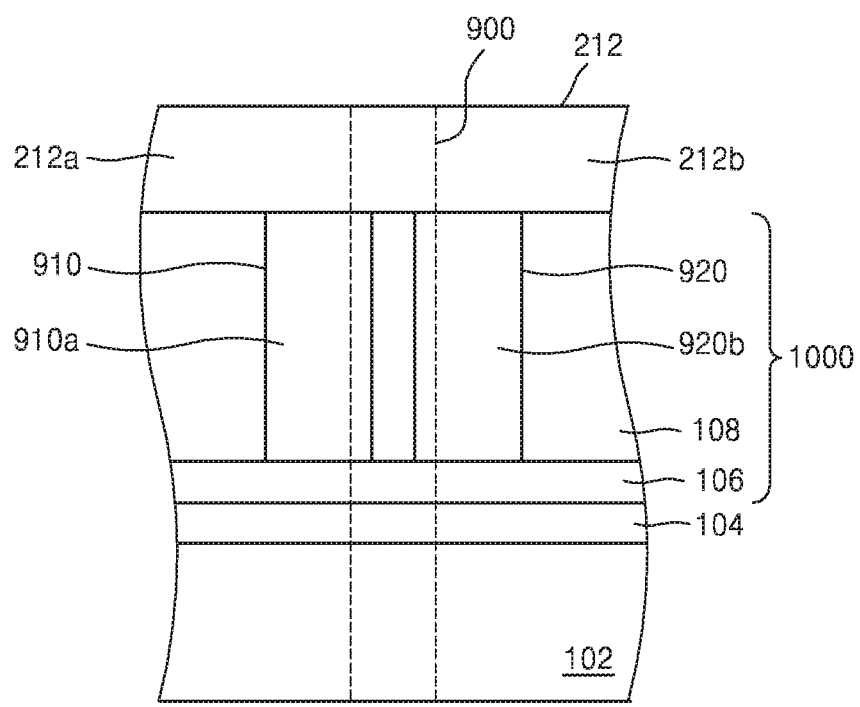
FIG. 10 is a cross-sectional view taken along line IV-IV' of FIG. 9.

FIGS. 9 and 10 illustrate a fourth example of a redistribution pad arrangement on a scribe lane, e.g., the scribe lane 210 of FIG. 2, according to the inventive concept. FIG. 8 is a cross-sectional view taken along line IV-IV' of FIG. 9.

Referring to FIG. 9, at least two conductive vias 910 and 920 contact the bottom portion of the redistribution pad 212. The conductive vias 910 and 920 are arranged obliquely like the conductive vias 710 and 720. The sawing line 900 may be set to pass through parts of the conductive vias 910 and 920 one after the other. Upper surfaces (or horizontal cross sections) of the conductive vias 910 and 920 are illustrated as rectangular. According to inventive concept, however, the upper surfaces (or horizontal cross sections) of the conductive vias 910 and 920 may be round, oval, triangular, hexagonal, or octagonal, or may have any other appropriate shape.

Referring to FIG. 10, a metal interconnection structure 1000 is disposed below the redistribution pad 212. The metal interconnection structure 1000 may include the metal layer 106 formed on the insulating layer 104 on the semiconductor substrate 102 and the conductive vias 910 and 920 in the intermetallic insulating layer 108 in contact with the metal layer 106.

In some examples, a plurality of metal interconnection structures 1000 each including a metal layer 106 and the conductive vias 910 and 920 in the intermetallic insulating layer 108 may be interposed between redistribution pads 212, respectively, and the semiconductor substrate 102. According to some examples, a plurality of conductive vias 910 and 920 may be arranged in a zigzag shape in the direction of the longitudinal axis of the scribe lane.

In FIG. 10, if the sawing line 900 passes through the conductive vias 910 and 920 of the redistribution pad 212 within the scribe lane 210, some conductive vias 910a and 920b and some redistribution pads 212a and 212b may remain in the scribe lane 210. Since the conductive vias 910a and 920b are stuck in the intermetallic insulating layer 108, a problem in which metal of the redistribution pads 212a and 212b in contact with the conductive vias 910a and 920b is separated or becomes particles and is blown away upon a sawing process may be prevented. Thus, the semiconductor chips 110 and 120 may be clearly isolated.

Figure 11:
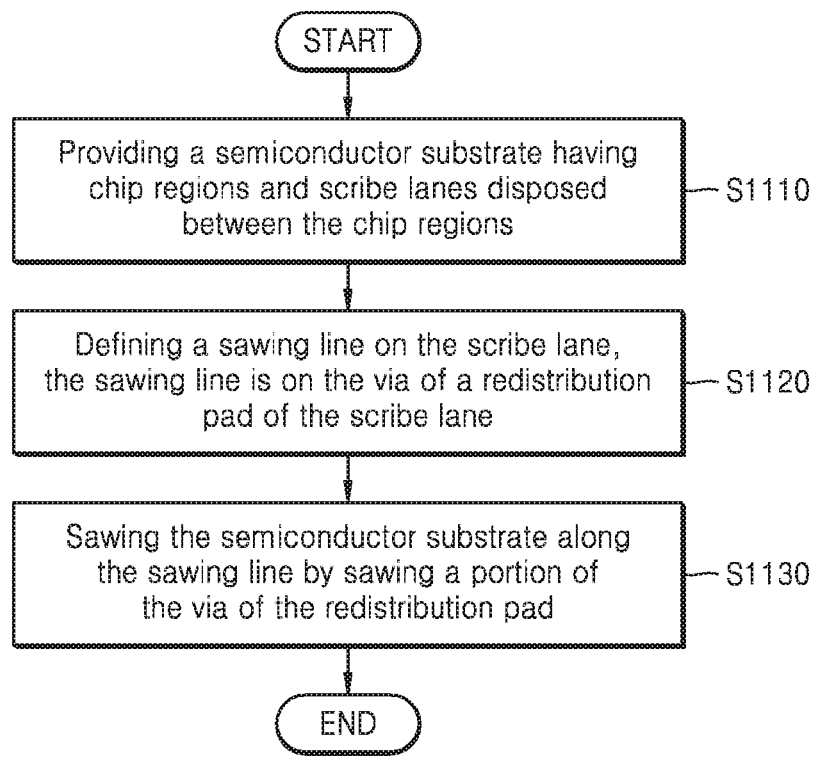
FIG. 11 is a flowchart of a method of sawing a semiconductor wafer, according to the inventive concept.

FIG. 11 is a flowchart of a method of sawing a semiconductor wafer, i.e., a method of forming or "singulating" chips, according to the inventive concept. In FIG. 11, the semiconductor wafer may be implemented as, for example, the semiconductor wafer 100 described with reference to FIGS. 1 through 10.

Referring to FIG. 11, in operation S1100, the semiconductor substrate 102 including the semiconductor chips 110, 120, 130, and 140 and the scribe lanes 210 and 220 arranged between the semiconductor chips 110, 120, 130, and 140 may be provided.

In operation S1120, the sawing lines 300, 500, 700, and 900 may be set above the conductive vias 310, 510, 520, 710, 720, 910, and 920 in the redistribution pad 212 included in the scribe lanes 210 and 220. The conductive vias 310, 510, 520, 710, 720, 910, and 920 in the redistribution pad 212 may be in the metal layer 106 formed on the semiconductor substrate 102 and the intermetallic insulating layer 108 in contact with the metal layer 106. The intermetallic insulating layer 108 may include a material, for example, oxide, nitride, oxynitride, a low-k dielectric, an ultra-low-k dielectric, and/or combinations thereof.

In operation S1130, the semiconductor substrate 102 may be sawn along the sawing lines 300, 500, 700, and 900 such that some of the conductive vias 310, 510, 520, 710, 720, 910, and 920 in the redistribution pad 212 are sawn. If the sawing lines 300, 500, 700, and 900 pass through the conductive vias 310, 510, 520, 710, 720, 910, and 920 of the redistribution pad 212 within the scribe lane 210, the some conductive vias 310a, 310b, 510a, 520b, 710a, 720b, 910a, and 920b and the some redistribution pads 212a and 212b may remain in the scribe lane 210.

Accordingly, since the conductive vias 310, 510, 520, 710, 720, 910, and 920 are stuck in the intermetallic insulating layer 108, a problem in which metal of the redistribution pads 212a and 212b in contact with the conductive vias 310, 510, 520, 710, 720, 910, and 920 is separated or becomes particles and is blown away upon a sawing process may be prevented.

While the inventive concept has been particularly shown and described with reference to various examples thereof, it will be understood that various changes in form and details may be made to such examples without departing from the spirit and scope of the following claims.

What is claimed is:

1. A method of singulating semiconductor chips, the method comprising:

providing a structure including a semiconductor substrate, respective integrated circuits of semiconductor chips arrayed across the semiconductor substrate as spaced from each other by scribe lanes, a redistribution pad in one of the scribe lanes, and at least one conductive via contacting a bottom portion of the redistribution pad, each said at least one conductive via having a widthwise dimension in a direction perpendicular to said one of the scribe lanes; and cutting a line in the semiconductor substrate along a longitudinal axis of said one of the scribe lanes, wherein the line along which the semiconductor substrate is cut has a width less than the width of said one of the scribe lanes and less than the widthwise dimension of each said at least one conductive via, and the line along with the semiconductor substrate is cut is located relative to said at least one conductive via such that one part of each said at least one conductive via is removed by the cutting whereas another part of each said at least one conductive via remains attached to the redistribution pad.

2. The method of claim 1, wherein the structure provided includes a metal layer on the semiconductor substrate and an intermetallic insulating layer in contact with the metal layer, and each said at least one conductive via extends in the intermetallic insulating layer and contacts the metal layer.

3. The method of claim 2, wherein the intermetallic insulating layer comprises at least one material selected from the group consisting of an oxide, a nitride, an oxynitride, a low-k dielectric, and an ultra-low-k dielectric.

4. The method of claim 1, wherein the structure provided includes a plurality of redistribution pads disposed in said one of the scribe lanes, each of the redistribution pads being electrically connected to a group of the integrated circuits of the semiconductor chips such that the integrated circuits of the semiconductor chips of the group can be simultaneously tested via the plurality of redistribution pads.

5. The method of claim 1, wherein each said at least one conductive via has a central region located along the longitudinal axis of said one of the scribe lanes, and the cutting of the semiconductor substrate cuts through the central region of each said at least one conductive via while leaving opposite side portions of each said at least one conductive via in place.

6. An article of manufacture for use in forming semiconductor chips, comprising:

a semiconductor substrate;

substantially identical integrated circuits arrayed across the semiconductor substrate in chip regions, respectively, the chip regions separated from one another by scribe lanes including a first scribe lane having a central longitudinal axis extending in a first direction and a second scribe lane having a central longitudinal axis extending longitudinally in a second direction crossing the first direction, whereby the first scribe lane and the second scribe lane cross one another in a region between first, second, third and fourth ones of the chip regions;

a first test circuit and a second test circuit disposed in the scribe lanes and spaced from each other on opposite sides of the central longitudinal axis of the first one of the scribe lanes;

a plurality of redistribution pads of electrically conductive material disposed on the semiconductor substrate in the first scribe lane as exposed at an upper part of the first scribe lane, the plurality of redistribution pads being electrically connected to the first and second test circuits;

first redistribution lines electrically connected in the second scribe lane to the first test circuit and electrically connected to the integrated circuits in the first and third ones of the chip regions;

second redistribution lines electrically connected in the second scribe lane to the second test circuit and electrically connected to the integrated circuits in the second and the fourth ones of the chip regions; and conductive vias contacting the redistribution pads, each of the conductive vias contacting a respective one of the redistribution pads at a bottom portion of the respective one of the redistribution pads, wherein the plurality of redistribution pads are electrically connected to the integrated circuits in the first, second, third and fourth ones of the chip regions.

7. The article of manufacture of claim 6, further comprising:

a metal layer disposed on the semiconductor substrate; and an intermetallic insulating layer interposed between the metal layer and the plurality of redistribution pads, and wherein each of the redistribution pads is disposed directly on the intermetallic insulating layer, and each of the conductive vias extends through the intermetallic insulating layer and contacts the metal layer.

8. The article of manufacture of claim 6, wherein the central longitudinal axis of the first scribe lane passes through a central region of each of the conductive vias.

9. The article of manufacture of claim 6, wherein two respective ones of the conductive vias contact each said respective one of the redistribution pads at the bottom portion of the respective one of the redistribution pads, the central longitudinal axis of the first scribe lane passes between the two respective ones of the conductive vias, and the two respective ones of the conductive vias are spaced apart from one another along a line crossing the central longitudinal axis.

10. The article of manufacture of claim 6, wherein the first test circuit and the second test circuit are disposed in the region in which the first scribe lane and the second scribe lane cross each other.

11. The article of manufacture of claim 6, wherein the plurality of redistribution pads are symmetrical about the central longitudinal axis of the first scribe lane.

* * * * *